United States Patent
Arima

(10) Patent No.: US 6,911,701 B2
(45) Date of Patent: Jun. 28, 2005

(54) METAL OXIDE SEMICONDUCTOR TRANSISTOR

(75) Inventor: Yutaka Arima, 1-4-5-502, Igisu, Iizuka, Fukuoka (JP), 820-0053

(73) Assignees: Mitsubishi Denki Kabushiki Kaisha, Tokyo (JP); Yutaka Arima, Fukuoka (JP)

( * ) Notice: Subject to any disclaimer, the term of this patent is extended or adjusted under 35 U.S.C. 154(b) by 0 days.

(21) Appl. No.: 10/765,203

(22) Filed: Jan. 28, 2004

(65) Prior Publication Data

US 2004/0207022 A1 Oct. 21, 2004

(30) Foreign Application Priority Data

Jan. 29, 2003 (JP) ........................................ 2003-020650
Jan. 29, 2003 (JP) ........................................ 2003-020651

(51) Int. Cl.[7] ............................................. H01L 29/76
(52) U.S. Cl. ............................... 257/368; 257/E21.681; 257/E21.685; 365/185.26
(58) Field of Search .................... 257/368, E21.681, 257/E21.685; 365/185.26

(56) References Cited

U.S. PATENT DOCUMENTS

| | | | | |
|---|---|---|---|---|
| 5,796,139 A | * | 8/1998 | Fukase | 257/315 |
| 2002/0145166 A1 | * | 10/2002 | Kachelmeier | 257/368 |
| 2003/0030081 A1 | | 2/2003 | Arima | |

FOREIGN PATENT DOCUMENTS

JP        2002-222944 A        8/2002

OTHER PUBLICATIONS

T. Shibata et al., "A Functional MOS Transistor Featuring Gate–Level Weighted Sum and Threshold Operations" *IEEE Transactions on Electron Devices*, Jun. 1992, pp. 1444–1455, vol. 39(6).

T. Hashimoto et al., "Thin Film Effects of Double–Gate Polysilicon MOSFET," *Extended Abstracts of the 22nd (1990 International) Conference on Solid State Devices and Materials*, Sendai, 1990, pp. 393–396, Japan.

T. Hiramoto et al., "Low Power and Low Voltage MOSFETs with Variable Threshold Contolled by Back–Bias," *IEICE Trans. Electron*, Feb. 2000, pp. 161–169, vol. E84–C(2).

* cited by examiner

Primary Examiner—Nathan J. Flynn
Assistant Examiner—Scott R. Wilson
(74) Attorney, Agent, or Firm—Leydig, Voit & Mayer

(57) ABSTRACT

A metal oxide semiconductor transistor includes a semiconductor substrate; a source area formed in a device area of the semiconductor substrate; a drain area formed in the device area; a gate layer formed on and across the device area between the source area and the drain area; a control gate layer; and a diffusion area formed in the device area between the gate area and the control gate area. The control gate layer has a first part including a first end of the control gate layer and a second part including a second end of the control gate layer. The first part is formed on the device area between the source area and the gate layer. The first end is disposed so that there is a gap between the first end and an edge of the device area.

13 Claims, 13 Drawing Sheets

Gc(gate)<<Gc(control gate)

Gc(gate)=Gc(control gate)

Gc(gate)>>Gc(control gate)

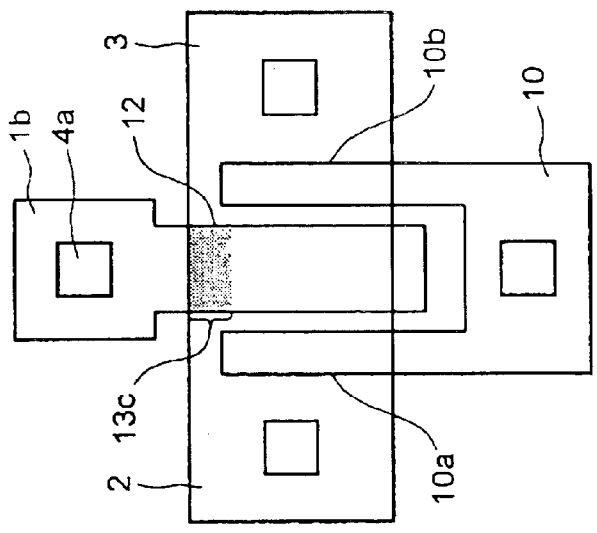
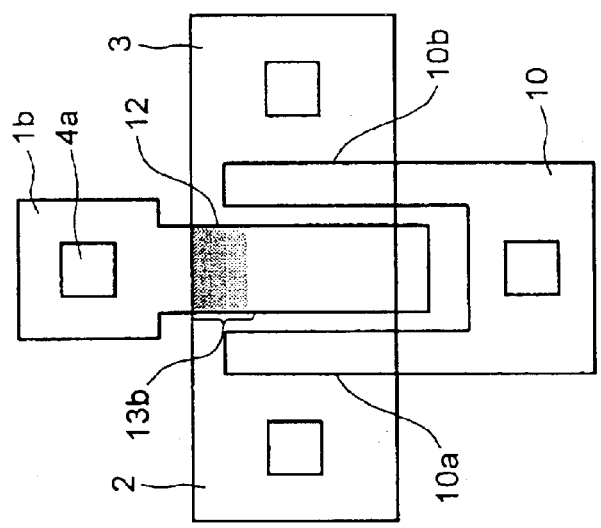
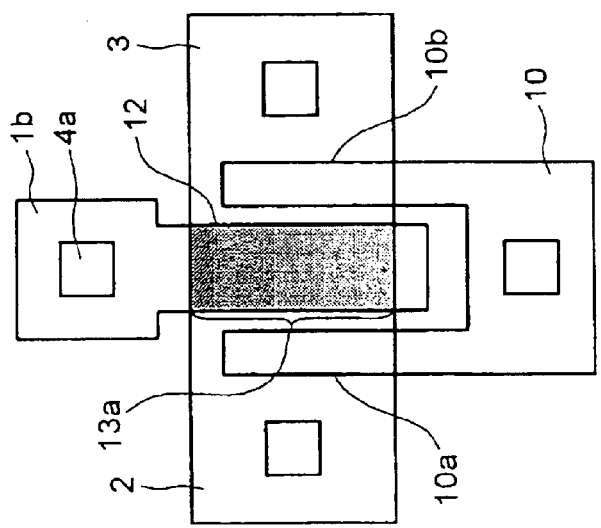

$Vtmiddle > Vcg > Vtmin$ $Vtmax > Vcg > Vtmiddle$ $Vcg > Vtmax$

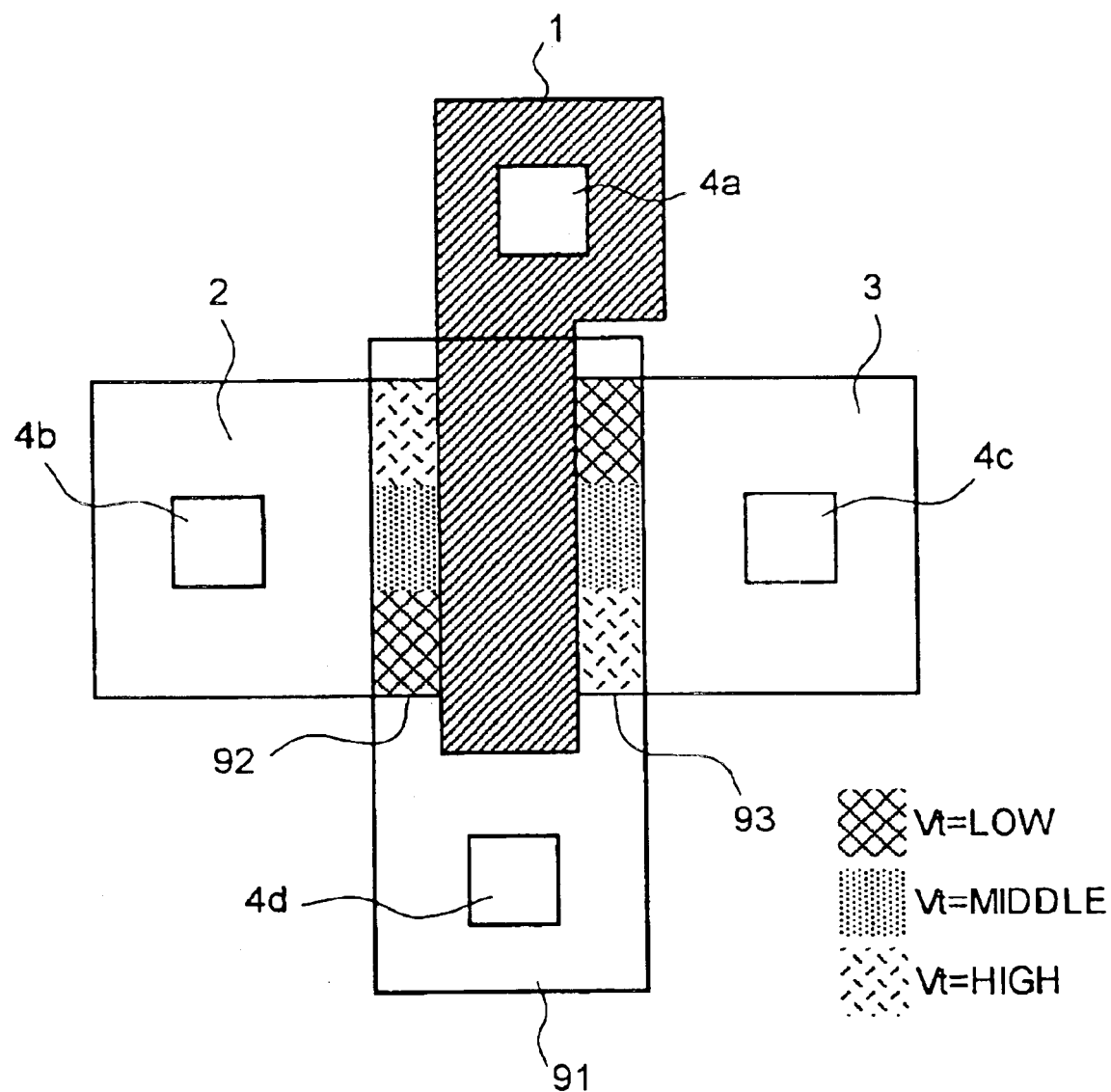

METAL OXIDE SEMICONDUCTOR TRANSISTOR

BACKGROUND OF THE INVENTION

1) Field of the Invention

The present invention relates to a metal oxide semiconductor (MOS) transistor in which a gain coefficient of a field-effect transistor can be modulated. The invention particularly relates to the MOS transistor to be a basic device which realizes new-type LSI devices such as self-optimizing LSI and a self-adapting LSI in which high performance of LSI is realized by optimizing individual transistors after manufacturing LSI in a large-scale and highly integrated semiconductor integrated circuit (LSI) device in the future.

2) Description of the Related Art

Recent LSI devices are large scaled and highly integrated according to development of miniaturized devices, and a system-on-chip is realized. As a result, it is being required to integrate a large variety of functional circuits in chips. In the design of such large-scale LSI devices, it is particularly important to optimize operation timing or the like between the functional circuits in order to properly operate the many integrated functional circuits.

On the other hand, the performance of LSI device has been improved mainly by miniaturization of devices for 30 or more years since its invention. In these days where various physical limits become obvious in the miniaturization of devices, however, it becomes extremely difficult to manufacture integrated circuit devices stably and uniformly.

As a result, the design of the LSI devices requires measures that secures an operating margin in order to cover a process fluctuation which cannot be avoided in the manufacturing process of LSIs. The measures that secures the operating margin interferes with heightening of performance of the large-scale LSI devices according to diversification and enlargement of the devices.

In such future LSI devices, non-uniformity of device characteristics for each LSI chip,.such as dispersion (distribution) of intra-chip device characteristics and a median fluctuation (shift) of device characteristics due to process fluctuation, and difficulty of LSI physical design (performance optimization design) due to the non-uniformity become obvious. For this reason, a performance heightening method for LSI devices which depends only on the miniaturization of devices is reaching a limit.

In order to improve the high performance of LSI devices, it is indispensable to establish new LSI design and manufacturing method in which the dispersion of the device characteristics larger than a certain level is premised. As one method relating to the LSI design and manufacturing method in which the dispersion of the device characteristics larger than a certain level is premised, a method of providing a self-adjusting function into LSI chips is considered.

Specifically, in such a method, electrical characteristics adjustment based on setting of a size (a gate length and a gate width) in individual field-effect transistors (e.g. MOS transistors), which is conventionally performed at the final LSI design step (physical design), is designed to be performed automatically by each chip itself after manufacturing of LSIs. As a result, the electrical characteristics of individual MOS transistors in the LSI chips are optimized so that the chip performance is heightened.

In order that the LSI chips realize the self-adjustment performance, it is necessary to provide a design that a program or electrical dynamics can automatically adjust the electrical characteristics into LSI chips. In order to realize this design, therefore, at least some kind of means that electrically modulates the electrical characteristics is essential, and technical development of such means gives the key to realize the self-adjustment function.

The method of electrically modulating the electrical characteristics which can be realized by using a conventional art is explained below. In the conventional art, when the electrical characteristics are electrically modulated, a method using a circuit configuration and a method of modulating characteristics of devices are mainly adopted.

The method using the circuit configuration includes a method of establishing a circuit configuration such that a plurality of MOS transistors are used and a number of their parallel connection is switched by an electric switch as explained in CIRCUIT 1 to CIRCUIT 4, for example. According to this method, effective electrical characteristics (gain coefficient) when the entire circuit is regarded as one MOS transistor can be modulated. The method that realizes the circuit is, however, very inefficient from viewpoints of adjustment accuracy and a circuit scale as explained below.

A configuration (CIRCUIT 1) such that two MOS transistors are connected in parallel is considered. In CIRCUIT 1, a normal signal voltage is applied to a gate electrode of one MOS transistor, and a signal voltage and an OFF voltage for OFF operation are switched so as to be applied to a gate electrode of the other MOS transistor.

According to this CIRCUIT 1, when a switch connects the signal voltage with the gate electrode of the other MOS transistor, the two MOS transistors connected in parallel-serve as one MOS transistor in this circuit. Further, when the switch connects the OFF voltage with the gate electrode of the other MOS transistor, only one MOS transistor functions in this circuit. As a result, the substantial gain coefficient of the MOS transistor can be modulated.

A configuration (CIRCUIT 2) such that five MOS transistors are connected in parallel is considered. In CIRCUIT 2, a normal signal voltage is applied to a gate electrode of one MOS transistor, and a signal voltage and an OFF voltage for OFF operation are switched so as to be applied to gate electrodes of the other four MOS transistors.

According to this CIRCUIT 2, sixteen variations can be realized by states of four switches. That is to say, the gain coefficients of the four MOS transistors are set to be a multiple of a power of 2, so that coefficients of 16 degrees can be set with equal intervals.

A configuration (CIRCUIT 3) such that two MOS transistors are connected in series is considered. In CIRCUIT 3, a normal signal voltage is applied to a gate electrode of one MOS transistor, and a signal voltage and an ON voltage for ON operation are switched so as to be applied to a gate electrode of the other MOS transistor.

According to this CIRCUIT 3, when a switch connects the signal voltage with the gate electrode of the other MOS transistor, the two MOS transistors are connected in series and perform the same operation. For this reason, the two MOS transistors serve as one normal MOS transistor in this circuit. Further, when the switch connects the ON voltage with the gate electrode of the other MOS transistor, this circuit serves as a circuit in which the one MOS transistor is connected with ON resistance of the other MOS transistor in series.

A configuration (CIRCUIT 4) such that two MOS transistors are connected in series is considered. In CIRCUIT 4, a normal signal voltage is applied to a gate electrode of one MOS transistor, and a control voltage which changes the ON resistance is applied to the gate electrode of the other MOS transistor. This circuit serves as a circuit that adjusts the resistance connected with the one MOS transistor in series.

The switch normally includes a complementary MOS (CMOS) switch which is connected with a P-channel MOS (hereinafter, "PMOS") transistor and an N-channel MOS (hereinafter, "NMOS") transistor in parallel, an inverter which generates a gate signal of the CMOS switch, and a latch circuit which holds a state of the switch. Totally about 24 MOS transistors are necessary.

In the circuit configuration examples adopting the series connection in CIRCUIT 1 and CIRCUIT 2, therefore, a trade-off relationship is established between accuracy of the characteristics adjustment and circuit scale, and this causes a problem that the circuit scale becomes large when the adjustment accuracy is heightened.

Further, in the circuit configuration examples adopting the parallel connection in CIRCUIT 3 and CIRCUIT 4, the circuit scale becomes large, and a resistance component which causes nonlinear characteristics of an input signal intervenes in series. For this reason, an effective characteristics adjustment range is limited.

The circuit configurations that modulate the electrical characteristics of the transistor has essential restriction such that devices whose number is several times or several-dozen times a number of devices to be adjusted should be required. These configurations hardly fit in packaging of the self-adjustment function which promotes high integration and heightens the performance of the LSI devices.

In prior MOS transistors, it is not easy to change the electrical characteristics after manufacturing LSI, but electrical characteristics of devices can be modulated by controlling a back gate voltage. The electrical characteristics of MOS transistors are roughly explained.

The electrical characteristics of MOS transistors can be expressed by the following equations in which Ids is a source-drain current, Vds is a source-drain voltage, Vgs is a gate voltage, Vt is a threshold voltage, and $\beta$ is a gain coefficient. The equations (1) and (2) below represent that no short channel effect or the like for simplicity is not produced.

$$Vds > Vgs-Vt, \quad Ids \approx \beta(Vgs-Vt)^2/2 \quad (1)$$

$$Vds \leq Vgs-Vt, \quad Ids \approx \beta((Vgs-Vt)Vds-Vds^2/2) \quad (2)$$

The gain coefficient $\beta$ can be expressed by the following equation (3) in which W is a gate width, L is a gate length, Tox is a thickness of a gate insulating film, $\mu$ is a carrier mobility, and $\epsilon$ is permittivity of the gate insulating film.

$$\beta \approx \mu \epsilon W/(L \cdot Tox) \quad (3)$$

As understood from the equations (1) and (2), the electrical characteristics of MOS transistors depend on the threshold voltage Vt. After LSI is manufactured, the threshold voltage Vt can be changed by controlling a back gate voltage. In a method of changing the electrical characteristics of MOS transistor after the manufacturing of LSI using the conventional art, therefore, the back gate voltage is changed so that the threshold voltage Vt is modulated.

A reverse bias relationship should be, however, maintained between the back gate voltage and the source-drain voltage, and additionally the back gate voltages should be electrically separated from each other for each device to be modulated. For this reason, this method is inadequate to high integration.

Further, a change in the threshold voltage Vt cannot influence the source-drain current Ids only according to a difference between the threshold voltage Vt and the gate voltage Vgs. For this reason, it is difficult that the electrical characteristics of MOS transistors are modulated dynamically only by changing the threshold voltage Vt.

That is to say, the system that modulates the transistor electrical characteristics by changing the threshold value Vt using the conventional art hardly fits in the packaging of the self-adjustment function which promotes high integration and heightens the performance of the LSI devices. This is because of inhibition of an integration degree and fragility of a modulation degree due to the separation of back gate.

In the conventional art, it is not easy to provide the self-adjustment function in a highly integrated manner, or to change the electrical characteristics after the manufacturing of LSI. It is, therefore, desired to develop new devices that can modulate the electrical characteristics dynamically without inhibiting high integration.

In the equation (3), since the carrier mobility $\mu$, the permittivity $\epsilon$, and the thickness of the gate insulating film Tox are, generally constant, the gain coefficient $\beta$ can be set by a ratio of the gate width W to the gate length L. The electrical characteristics of MbS transistors which can be set in the physical design of LSI devices are, therefore, the gain coefficient $\beta$.

When the gain coefficient $\beta$ can be modulated, as is clear from the equations, the source-drain current Ids can be strongly influenced in proportion to the product of the gate voltage Vgs and the gain coefficient $\beta$. For this reason, the electrical characteristics of MOS transistors can be modulated dynamically. That is to say, the gain coefficient $\beta$ can be electrically modulated to be about several times or several dozen times, so that correction of dispersion of the device characteristics, automatic compensation of a load change, and the like which match the modulation can be made after the manufacturing of LSI devices.

At this time, it is important for basic devices for active LSI to be capable of analog-modulating the gain coefficient $\beta$ with a compact device size which does not inhibit high integration.

From such a viewpoint, the inventor has devised a semiconductor device which is capable of modulating a gain coefficient of a field-effect transistor (see Japanese Patent Application Laid-Open No. 2002-222944). The semiconductor device in Japanese Patent Application Laid-Open No. 2002-222944 is called as a gain coefficient variable MOS transistor, and its summary is explained.

Configurational characteristics of the gain coefficient variable MOS transistor are such that a control gate is additionally arranged in a gate area (main gate) in a prior MOS transistor in a slanted manner. That is to say, the gain coefficient variable MOS transistor is characterized in that a triangular area is formed on a source area side and a drain area side which are not overlapped with the main gate in a channel area under a control gate, and these areas form a parallelogram in a state that they sandwiching the main gate.

The modulation characteristics of the gain coefficient $\beta$ can be set by device shape parameters (a gate width W and a gate length L of the main gate, and an angle $\theta$ formed between the main gate and the control gate).

According to this configuration, a direction of an electric field with respect to the gate channel can be controlled by a voltage of the control gate. That is to say, the voltage of the control gate is adjusted, and a conductance of the control gate channel is changed with respect to a conductance of the main gate, so that the effective gate length L and gate width W can be analog-modulated. As a result, the gain coefficient β can be analog-modulated.

The gain coefficient variable MOS transistor is incorporated into LSI, therefore, so that characteristics of a device can be adjusted dynamically by on-chip itself. As a result, a mechanism, that automatically corrects an operation timing between built-in functional circuits due to enlargement of LSI and dispersion of the device characteristics which increases due to miniaturization of devices, can be realized in a highly integrated manner.

In the semiconductor device in Japanese Patent-Application Laid-Open No. 2002-222944, however, since the control gate is arranged so as to be overlapped with the main gate, it is necessary to additionally provide the second gate layer which can be electrically separated from the main gate. As a result, a number of the manufacturing steps of LSI mounted with the semiconductor device increases in comparison with the normal CMOS process, and thus a manufacturing cost increases.

Further, in the semiconductor device in Japanese Patent Application Laid-Open No. 2002-222944, the control gate which forms a certain angle with respect to the main gate is additionally provided in order to form the rectangular area on the main gate on the source area side and the drain area side. For this reason, the size of the device becomes large.

Further, the modulation characteristics of the gain coefficient in the semiconductor device are determined by a conductance ratio of the main gate to the control gate. For this reason, as the conductance of the main gate becomes smaller, the modulation degree of the gain coefficient becomes smaller.

SUMMARY OF THE INVENTION

It is an object of the present invention to at least solve the problems in the conventional technology.

A metal oxide semiconductor transistor according to one aspect of the present invention includes a semiconductor substrate; a source area formed in a device area of the semiconductor substrate; a drain area formed in the device area; a gate layer formed on and across the device area between the source area and the drain area; a control gate layer; and a diffusion area formed in the device area between the gate area and the control gate area. The control gate layer has a first part including a first end of the control gate layer and a second part including a second end of the control gate layer. The first part is formed on the device area between the gate layer and at least one of the source area and the drain area, and the first end is disposed so that there is a gap between the first end and an edge of the device area.

A metal oxide semiconductor transistor according to another aspect of the present invention includes a semiconductor substrate; a source area formed in a device area of the semiconductor substrate; a drain area formed in the device area; a gate layer formed on and across the device area between the source area and the drain area; and a control channel area formed in the device area between the gate layer and at least one of the source area and the drain area. The control channel area has a threshold value that gradually changes in a longitudinal direction of the gate layer.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIGS. 5A to 5C are diagrams explaining a gate channel width modulating operation realized by the MOS transistor shown in FIG. 1B;

FIG. 19 is a top view illustrating a configuration of a MOS transistor according to a ninth embodiment of the present invention.

DETAILED DESCRIPTION

Exemplary embodiments of a MOS transistor relating to the present invention will be explained in detail below with reference to the accompanying drawings.

Figure 1A:
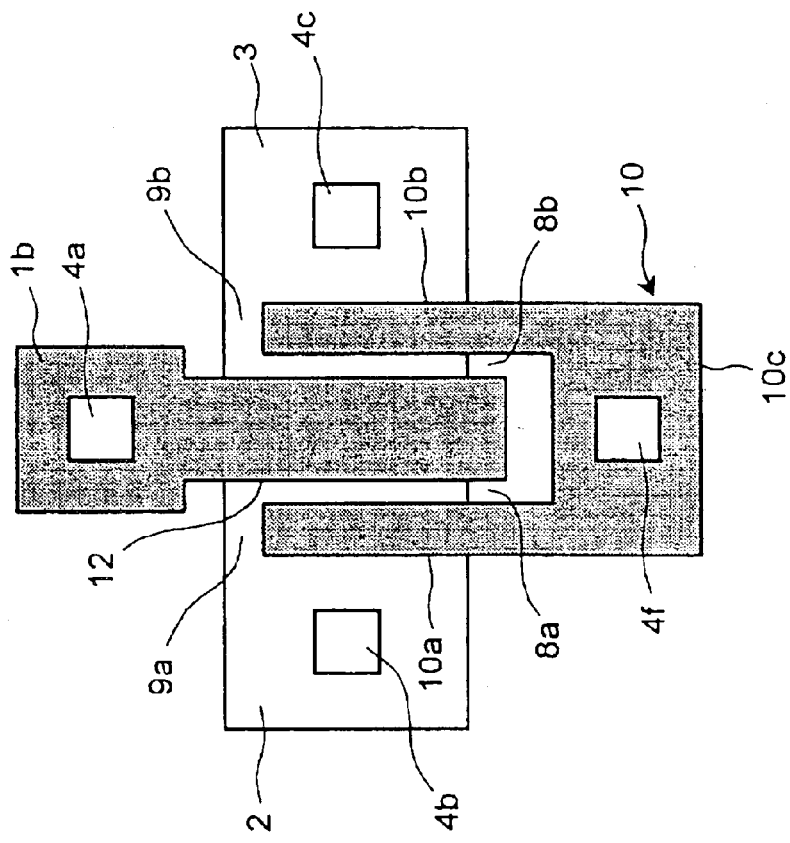
FIGS. 1A and 1B are top pattern diagrams illustrating a configuration of a MOS transistor according to a first embodiment of the present invention.
Figure 1B:
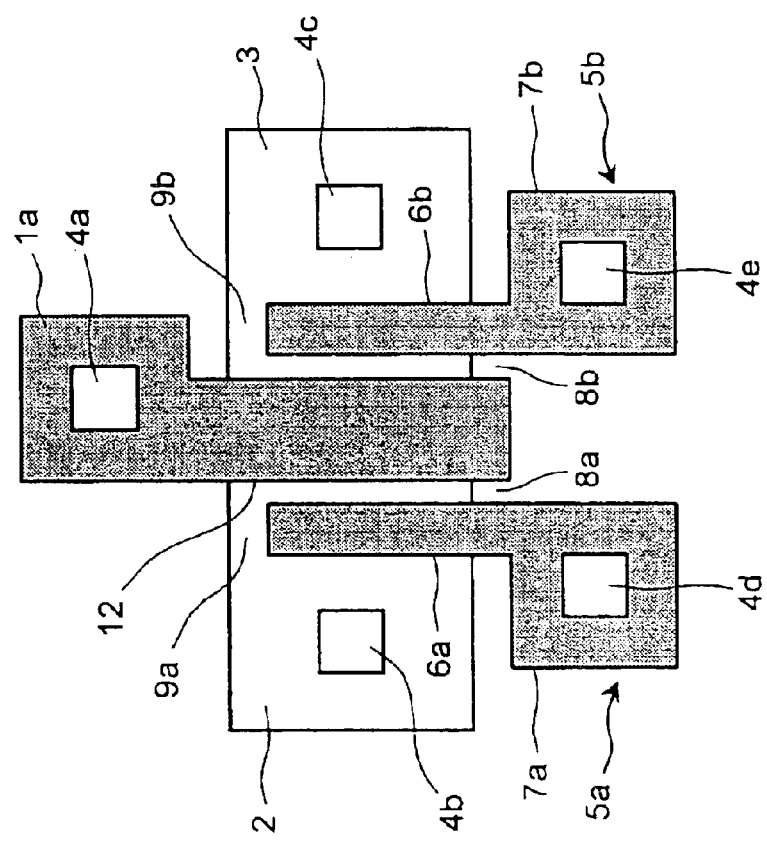

FIGS. 1A and 1B are top pattern views illustrating a configuration of a MOS transistor according to a first embodiment of the present invention. In FIGS. 1A and 1B, as is well known, the MOS transistor is configured so that a channel area 12 in gate areas 1a and 1b is arranged between a source area 2 and a drain area 3 (a central position) so as to cross a channel formed between the source area 2 and the drain area 3 (hereinafter, "gate channel"). A contact forming area is extended on one end of the channel area 12 (upper portion in the drawing), so that a contact 4a is composing an electrode is provided. Contacts 4b and 4c composing electrodes are provided in the source area 2 and the drain area 3.

In such the MOS transistor according to the first embodiment, as shown in FIG. 1A, the gate area 1a is called as a main gate 1a hereinafter, and control gates 5a and 5b are formed by a gate layer similar to the main gate 1a on both sides of the channel area 12 of the main gate 1a in a gate lengthwise direction, namely, on a side of the source area 2 and a side of the drain area 3. In other words, the main gate 1a and the control gates 5a and 5b are formed on a common plane. The gate layer is generally formed by a polysilicon or a metal layer.

The control gates 5a and 5b include control gate areas 6a and 6b arranged parallel with the channel area 12 of the main gate 1a, and contact forming areas 7a and 7b extended on one ends of control gate areas 6a and 6b (lower portion in the drawing).

Contacts 4d and 4e composing electrodes are provided on the contact forming areas 7a and 7b. FIGS. 1A and 1B illustrate examples that the contact forming areas 7a and 7b and the contact forming area of the main gate 1a are formed on sides opposite to each other with respect to a line segment which connects the source area 2 with the drain area 3.

The control gate areas 6a and 6b are formed so that diffusion areas of gaps 8a and 8b are provided between side edges of the control gate areas 6a and 6b in its lengthwise direction and a side edge of the channel area 12 of the main gate 1a in a lengthwise direction.

The control gate areas 6a and 6b are not formed on the entire gate width in the channel area 12 of the main gate 1a, namely, across the entire width of the gate channel. Hiatus portions 9a and 9b where the control gates are not present, however, formed on one end sides of the gate channel width, i.e., the other ends (upper portion in the drawing) of the control gate areas 6a and 6b in the illustrated example, namely, on the sides of the contact 4a of the main gate 1a, respectively.

In FIG. 1B, an entire portion, where the contact forming areas 7a and 7b of the control gates 5a and 5b in FIG. 1A are unified, is used as the control gate 10, and it has one contact 4f. That is to say, the control gate 10 includes control gate areas 10a and 10b which are arranged parallel on both sides of the channel area 12 of the main gate 1b in the gate lengthwise direction with the gaps 8a and 8b are being formed, and a contact forming area 10c which connects one ends of the control gate areas 10a and 10b. The hiatus portions 9a and 9b are provided on the other ends (upper portion in the drawing) of the control gate areas 10a and 10b. Hereinafter, the configuration of FIG. 1B is adopted for convenience of the explanation.

Figure 2:
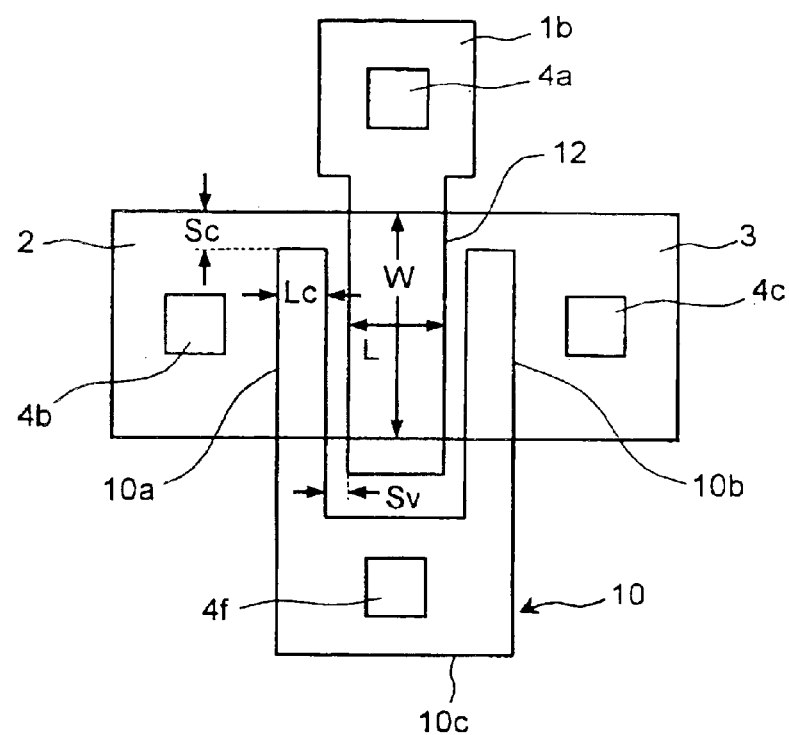
FIG. 2 is a diagram explaining shape parameters defining characteristics of the MOS transistor shown in FIG. 1B.
Figure 3:
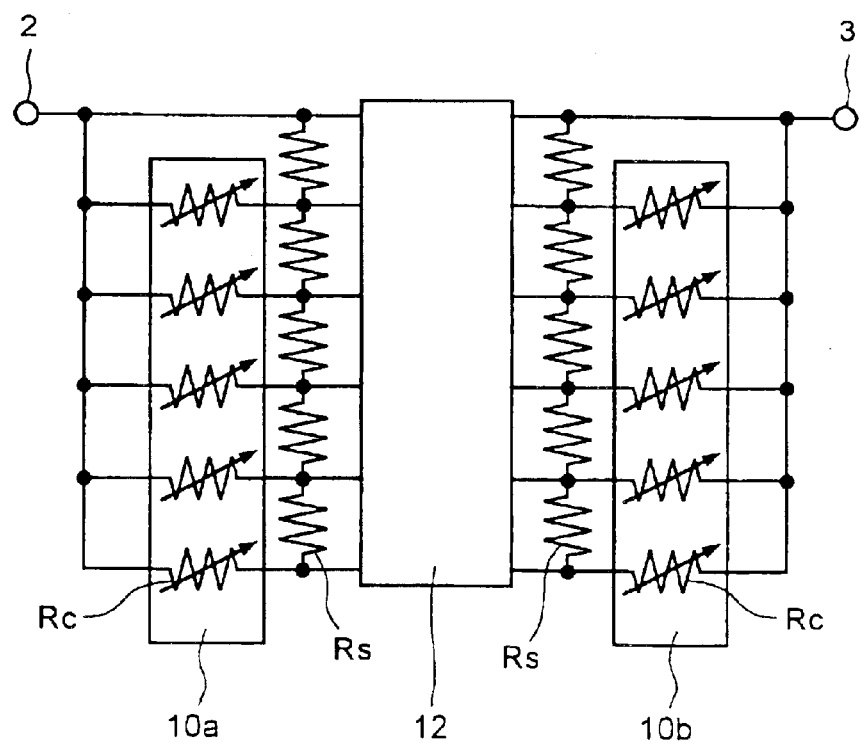
FIG. 3 is an equivalent circuit diagram in which the MOS transistor shown in FIG. 1B is expressed by an electronic circuit.
Figure 4A:
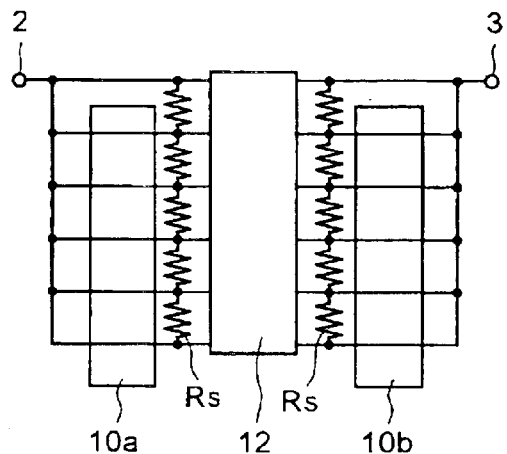
FIGS. 4A to 4C are equivalent circuit diagrams when a channel conductance of a control gate in the MOS transistor shown in FIG. 1B changes with respect to a channel conductance of a main gate.
Figure 4B:
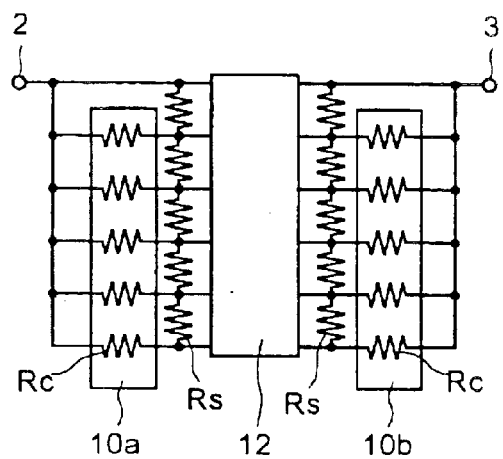
Figure 4C:
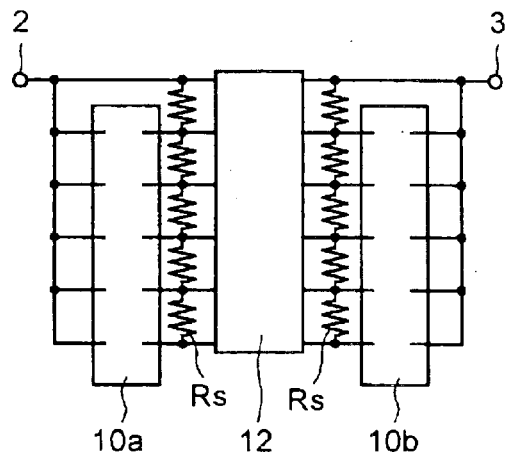

An operating principle which modulates the gain coefficient of the MOS transistor having the above configuration is explained below with reference to FIG. 1B to FIG. 5. FIG. 2 is a diagram explaining shape parameters for defining characteristics of the MOS transistor shown in FIG. 1B. FIG. 3 is an equivalent circuit diagram in which the MOS transistor shown in FIG. 1B is expressed by an electronic circuit. FIGS. 4A to 4C are equivalent circuit diagrams when a channel conductance of the control gate in the MOS transistor shown in FIG. 1B changes with respect to a channel conductance of the main gate. FIGS. 5A to 5C are diagrams explaining a gate channel width modulating operation realized by the MOS transistor shown in FIG. 1B.

According to this configuration, a conductance (1/resistance) of the control channel, which is formed under the control gate areas 10a and 10b, can be controlled by a voltage to be applied to the control gate 10. As a result, an effective channel width of the gate channel formed under the channel area 12 of the main gate 1b is modulated so that the gain coefficient β can be modulated by a voltage.

Channel modulation characteristics to be realized can be set by the shape parameters shown in FIG. 2. In FIG. 2, the shape parameters include a gate length L and a gate width W in the channel area 12 of the main gate 1b, a gate length Lc of the control gate areas 10a and 10b in the control gate 10, a gap Sv between the control gate areas 10a and 10b and the channel area 12 in the main gate 1b (diffusion area), and a gap Sc between the hiatus portion where the control gate areas 10a and 10b are not present. These parameters are adjusted so that the modulation characteristics of the gain coefficient β can be designed.

In order to ease understanding of the operating principle, the equivalent circuit of the MOS transistor shown in FIG. 1B is considered. In the MOS transistor shown in FIG. 1B, the control gate areas 10a and 10b can be considered as variable resistors. Further, a resistance component (fixed resistor) which depends on the diffusion area is present between the control gate areas 10a and 10b and the channel area 12 of the main gate 1b. Since the other ends of the control gate areas 10a and 10b are dropped out, the source area 2 and the drain area 3 are connected directly with the channel area 12 on the hiatus portions. The MOS transistor shown in FIG. 1B can be, therefore, represented as shown in FIG. 3, for example. Since accuracy is not important in the understanding of the operating principle, the resistors are present discretely so that the circuit configuration is simplified in FIG. 3.

As shown in FIG. 3, some portions of the source area 2 and the drain area 3 are connected directly with the channel area 12. A plurality of variable resistors Rc representing the control gate area 10a are connected in parallel between the channel area 2 and the source area 2. Similarly, a plurality of variable resistors Rc representing the control gate area 10b are connected in parallel between the channel area 12 and the drain area 3. Further, a plurality of fixed resistors Rs are connected in series between the channel area 12 and the control gate area 10a. Similarly, a plurality of fixed resistors Rs are connected in series between the channel area 12 and the control gate area 10b.

A principle that the channel width of the main gate is modulated by the channel conductance of the control gate is explained with reference to FIGS. 4A and 5A. FIGS. 4A and 5A illustrate the case where the channel conductances Gc (control gate) of the control gate areas 10a and 10b are extremely larger than the channel conductance Gc (gate) of the channel area 12 of the main gate 1b. FIGS. 4B and 5B illustrate the case where both the conductances are equal. FIGS. 4C and 5C illustrate the case where the channel conductances Gc (control gate) of the control gate areas 10a and 10b are extremely smaller than the channel conductance Gc (gate) of the channel area 12 of the main gate 1b.

When the channel conductances Gc (control gate) of the control gate areas 10a and 10b are extremely larger than the channel conductance Gc (gate) of the channel area 12 of the main gate 1b (Gc (gate)<<Gc (control gate), as shown in FIG. 4A, it is regarded that the variable resistances Rc are regarded as not being present. As shown in FIG. 5A, therefore, a width of an effective channel 13a in the channel area 12 of the main gate 1 spreads over approximately entire width of the channel area 12. For this reason, this width is comparatively large.

In the equivalent circuit shown in FIG. 4A, a general resistance of the fixed resistors Rs becomes larger from the top to the bottom in the drawing in a gate channel other than a portion which is connected directly with the source area 2 and the drain area 3. In the effective channel 13a shown in FIG. 5A, therefore, a color is darkened so that large electric current flows in the other ends of the control gate areas 10a and 10b (upper portion in the drawing). A black color is thinner towards the one ends of the control gate areas 10a and 10b (lower portion in the drawing), and this represents that the flowing electric current is gradually small.

When the channel conductances Gc (control gate) of the control gate areas 10a and 10b are extremely smaller than the channel conductance Gc (gate) of the channel area 12 of the main gate 1b (Gc (gate)>>Gc (control gate), the variable resistors Rc have extremely large resistance. For this reason, in FIG. 4C, the connection can be regarded as being cut off between the channel area 12 and the source area 2 and between the channel area 12 and the drain area 3.

In this case, electric current flows only in the area which is connected directly with the source area 2 and the drain area 3. As shown in FIG. 5C, therefore, the width of an effective channel 13c in the channel area 12 of the main gate 1b becomes an area corresponding to the hiatus portions being present on the other ends (upper portion in the drawing) of the control gate areas 10a and 10b in the channel area 12, respectively. As a result, the width is considerably narrow.

When the channel conductance Gc (control gate) of the control gate areas 10a and 10b are equal with the channel conductance Gc (gate) of the channel area 12 of the main gate 1b (Gc (gate)=Gc (control gate), as shown in FIG. 4B, the variable resistors Rc can be regarded as being fixed resistors. In this case, as shown in FIG. 5B, the width of an effective channel 13b in the channel area 12 of the main gate 1b becomes an intermediate channel width.

The modulation degree of the channel width depends on resistor components (Rs) of the diffusion area as the source-drain area sandwiched between the channel area 12 of the main gate 1b and the control gate areas 10a and 10b of the control gate 10, and channel resistor components (Rc) of the control gate areas 10a and 10b. In general, as the resistance components (Rs) of the source-drain area are higher, or as a change in the channel resistance components (Rc) is larger, the modulation degree of the channel width of the main gate becomes larger.

In the MOS transistor according to the first embodiment, the effective channel width of the gate channel can be adjusted by a voltage to be applied to the control gate. That is to say, analog modulation can be made on the drain current characteristics electrically. For this reason, the gain coefficient β of the MOS transistor can be modulated.

An electric power consumed by the modulation of the gain coefficient β is only a leak current from the control gate. This electric current is very small, and this does not substantially become a problem.

Figure 6A:
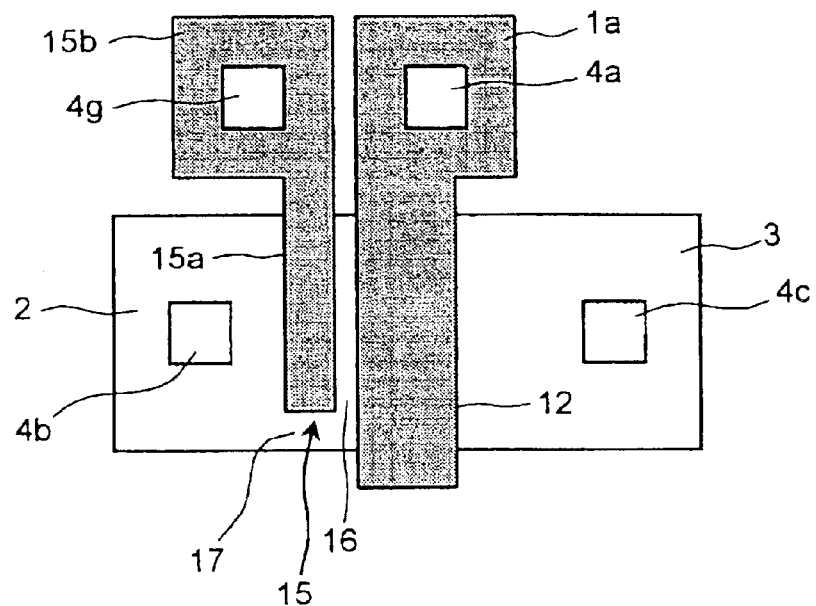
FIGS. 6A and 6B are top pattern diagrams illustrating a configuration of a MOS transistor according to a second embodiment of the present invention.
Figure 6B:
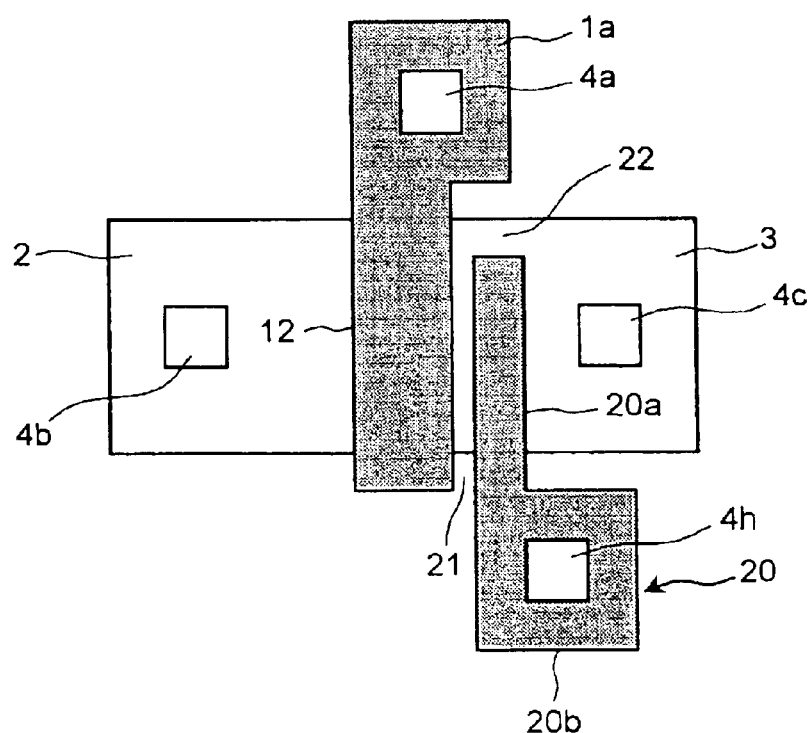

FIGS. 6A and 6B are top pattern diagrams illustrating the configuration of a MOS transistor according to a second embodiment of the present invention. The second embodiment explains the MOS transistor in which the control gate is provided on one side of the main gate in the gate lengthwise direction, namely, any one of the sides of the source area and the drain area in the MOS transistor shown in FIG. 1A.

In FIG. 6A, the control gate 15 is formed by a gate layer which is the similar to the main gate 1a between the main gate 1a and the source area 2. The control gate 15 includes the control gate area 15a, and the contact forming area 15b which is extended to one end of the control gate area 15a.

The control gate area 15a is arranged parallel in a state that the gap 16 is provided between the control gate area 15a and the channel area 12 of the main gate 1a, and the hiatus portion 17 of a predetermined gap is provided on the other end. FIG. 6A illustrates an example in which the contact forming area 15b provided with the contact 4g forming the electrode is arranged on the same side as the contact forming area of the main gate 1a.

In FIG. 6B, the control gate 20 is formed by the gate layer similar to the main gate 1a between the main gate 1a and the drain area 3. The control gate 20 includes the control gate area 20a, and the contact forming area 20b which is extended to one end of the control gate area 20a.

The control gate area 20a is arranged parallel in a state that the gap 21 is provided between the control gate area 20a and the channel area 12 of the main gate 1a, and the hiatus portion 22 of a predetermined gap is provided on the other end. The FIG. 6B illustrates an example in which the contact forming area 20b provided with the contact 4h forming the electrode is arranged on the opposite side to the contact forming area of the main gate 1a with respect to a line segment which connects the source area 2 and the drain area 3.

Also in the MOS transistor in which the control gate is provided on one end of the main gate 1a in the gate lengthwise direction, as explained with reference to FIGS. 4A to 5C, the effective channel width in the channel area 12 of the main gate 1a can be modulated by adjusting the voltage to be applied to the control gate 15 (or control gate 20). As a result, the gain coefficient β of the MOS transistor can be modulated.

Figure 7:
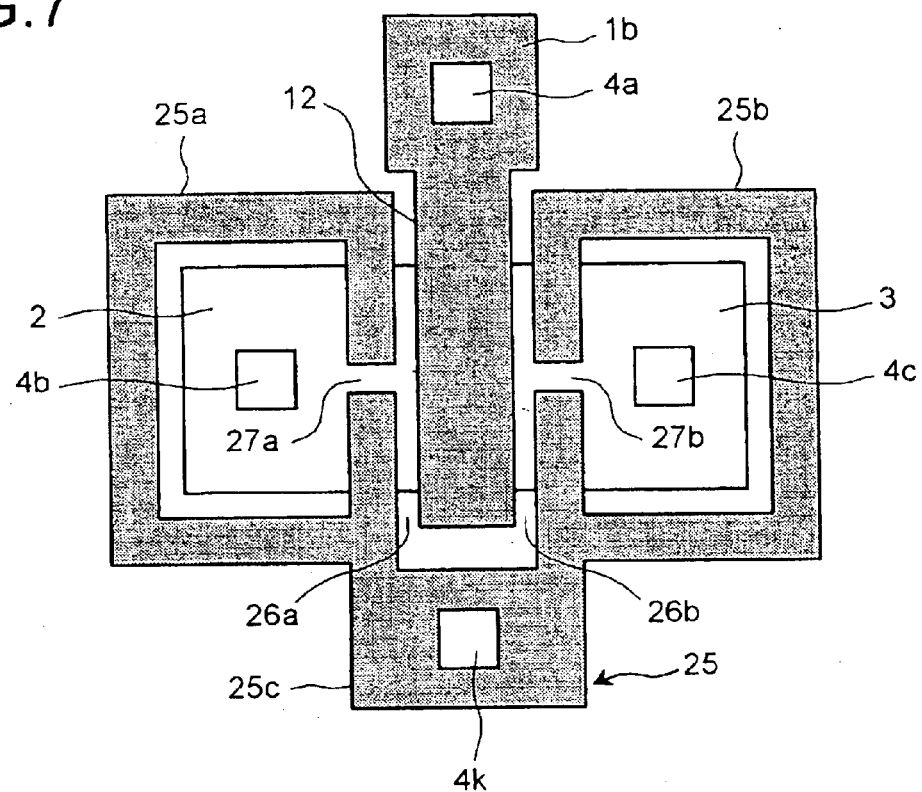
FIG. 7 is a top pattern diagrams illustrating a configuration of a MOS transistor according to a third embodiment of the present invention.

FIG. 7 is a top pattern diagram illustrating the configuration of a MOS transistor according to a third embodiment of the present invention. The third embodiment explains another configuration example of the MOS transistor in which the control gates are provided on both sides of the main gate in the gate lengthwise direction, namely, on the sides of the source area and the drain area, respectively, in the MOS transistor shown in FIG. 1B.

In FIG. 7, the control gate 25 includes the control gate areas 25a and 25b, and the contact forming area 25c in the gate lengthwise direction in the channel area 12 of the main gate 1b. The control gate area 25a is arranged so as to surround the source area 2. The control gate area 25b is arranged so as to surround the drain area 3. The contact forming area 25c connects the control gate areas 25a and 25b.

The control gate areas 25a and 25b have side edges which are parallel with the gaps 26a and 26b being provided between the side edges and the channel area 12. The side edges are provided with the hiatus portions 27a and 27b of predetermined gaps in a substantially central position of the gate width of the channel area 12, namely, a position corresponding to the approximately central position of the gate channel width.

The contact forming area 25c is provided with the contact 4k composing the electrode. FIG. 7 illustrates an example in which the contact forming area 25c of the control gate 25 and the contact forming area of the main gate 1b are arranged on opposite sides with respect to a line segment which connects the source area 2 and the drain area 3.

That is to say, in the first and the second embodiments, the control gate areas of the control gate are provided so as to have the hiatus portions on their one ends of the gate channel width, but in the third embodiment, the control gate areas are formed so as to have the hiatus portions in the substantially central position of the gate channel with. In response to the second embodiment, only one of the control gate areas 25a and 25b shown in FIG. 7 may be provided.

In such the MOS transistor having such a configuration, as explained with reference to FIGS. 4A to 5C, the effective channel width in the channel area 12 of the main gate 1b can be modulated by adjusting the voltage to be applied to the control gate 25. As a result, the gain coefficient β of the MOS transistor can be modulated.

According to the third embodiment, an area where an electric current is concentrated is always a central portion of the gate channel, and it is separated from a device separating wall. For this reason, this central portion is hardly influenced by defect or electric charges present in an interface of the separating wall, and thus the electrical characteristics with less dispersion can be realized.

Figure 8:
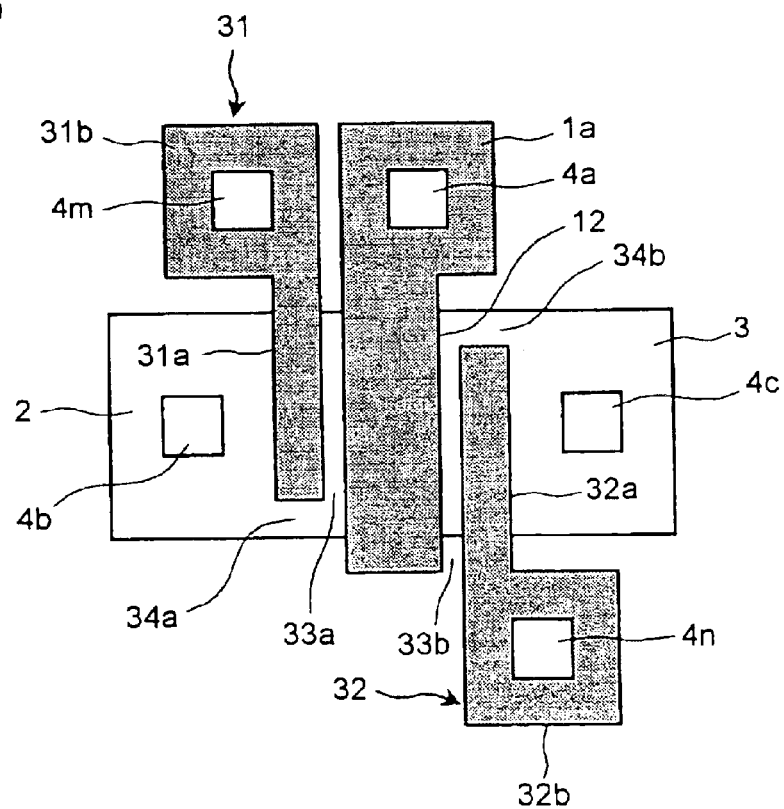
FIG. 8 is a top pattern diagrams illustrating a configuration of a MOS transistor according to a fourth embodiment of the present invention.

FIG. 8 is a top pattern diagram illustrating the configuration of a MOS transistor according to a fourth embodiment of the present invention. The fourth embodiment explains still another configuration example of the MOS transistor in which the control gates are provided on both the sides of the main gate in the gate lengthwise direction, namely, on the sides of the source area and the drain area, respectively, in the MOS transistor shown in FIG. 1A.

The MOS transistor shown in FIG. 8 includes the control gate 15 shown in FIG. 6A and the control gate 20 shown in FIG. 6B. That is to say, in the fourth embodiment, the control gates are formed so as to have the hiatus portions on both the ends of the gate channel width.

In FIG. 8, the control gates 31 and 32 are formed by the gate layer similar to the main gate 1a on both the sides of the gate lengthwise direction in the channel area 12 of the main gate 1a.

The control gate 31 arranged between the main gate 1a and the source area 2 includes the control gate area 31a, and the contact forming area 31b which is extended to one end (upper portion in the drawing) in the control gate area 31a.

The control gate area 31a is arranged parallel so that the gap 33a is provided between the control gate area 31a and the channel area 12 of the main gate 1a. The hiatus portion 34a of a predetermined gap is provided on the other end (lower portion in the drawing). FIG. 8 illustrates an example in which the contact forming area 31b provided with the contact 4m forming the electrode is arranged on the same side as the contact forming area of the main gate 1a.

The control gate 32 arranged between the main gate 1a and the drain area 3 includes the control gate area 32a, and the contact forming area 32b which is extended to one end (lower portion in the drawing) of the control gate area 32a.

The control gate area 32a is arranged parallel so that the gap 33b is provided between the control gate area 32a and the channel area 12 of the main gate 1a. The hiatus portion 34b of a predetermined gap is provided on the other end (upper portion in the drawing). FIG. 8 illustrates an example in which the contact forming area 32b provided with the contact 4n forming the electrode is arranged on the opposite side to the contact forming area of the main gate 1a with respect to the line segment which connects the source area 2 and the drain area 3.

In the MOS transistor, in which the control gates are formed so as to have the hiatus portions on both the ends of the gate channel width, as explained with reference to FIGS. 4A to 5C, the effective channel width in the channel area 12 of the main gate 1b can be modulated by adjusting the voltage to be applied to the control gate 25. As a result, the gain coefficient β of the MOS transistor can be modulated.

Further, according to the fourth embodiment, since the channel length is modulated besides the modulation of the channel width of the main gate, the gain coefficient β can be modulated dynamically.

Figure 9:
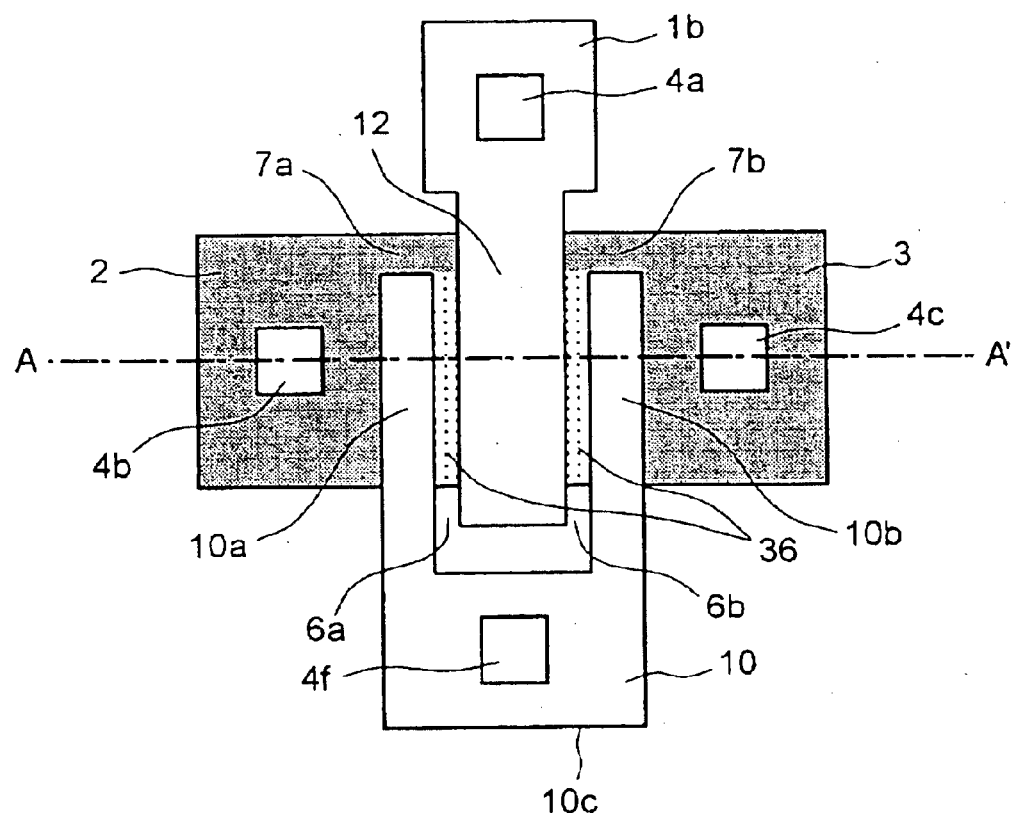
FIG. 9 is a top pattern diagrams illustrating a configuration of a MOS transistor according to a fifth embodiment of the present invention.
Figure 10:
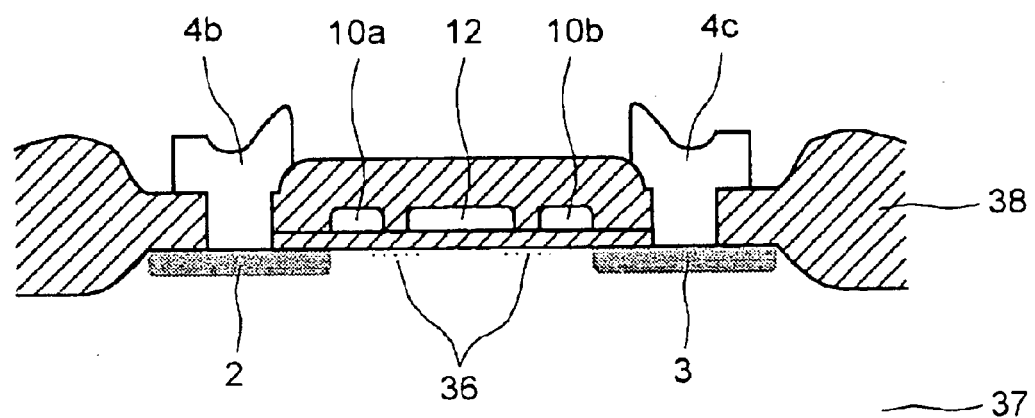
FIG. 10 is a cross-sectional view taken along line X—X of FIG. 9.

FIG. 9 is a top pattern diagram illustrating the configuration of a MOS transistor according to a fifth embodiment of the present invention. FIG. 10 is a cross-sectional view taken along line X—X shown in FIG. 9. The fifth embodiment explains still another configuration example of the MOS transistor in which the control gates are located on opposite sides of the main gate, in the lengthwise direction of the gate, namely, on the source area and the drain area sides in the MOS transistor shown in FIG. 1B.

In FIG. 9, the diffusion areas 36 between the channel area 12 of the main gate 1b and the control gate areas 10a and 10b of the control gate 10 is impurity diffusion areas which are similar to the source area 2 and the drain area 3. In the fifth embodiment, however, impurity concentration of the diffusion areas 36 is lower than impurity concentration of the source area 2 and the drain area 3.

As shown in FIG. 10, the channel area 12 of the main gate 1b and the control gate areas 10a and 10b of the control gate 10 are formed on an upper surface of a board (well area) so as to be separated from each other by an insulating layer 38. The diffusion areas 36 between the channel area 12 and the control gate areas 10a and 10b of the control gate 10 are formed on the upper surface of the base (well area) 37 when the source area 2 and the drain area 3 are formed.

At this time, the impurity concentration of the diffusion areas 36 can be set to be lower than the impurity concentration of the source area 2 and the drain area 3 by a method of making an injection amount of the impurity different by introducing a photo mask for separating the respective areas.

In another method, a new mask is not added, but the gaps between the channel area 12 and the control gate areas 10a and 10b of the control gate 10 (Sv in FIG. 2) are optimized. As a result, an LDD (Lightly Doped Drain) configuration can be utilized, so that the impurity concentration of the diffusion areas 36 can be set to be lower than that of the source area 2 and the drain area 3.

When the impurity concentration of the diffusion areas 36 is set to be lower than that of the source area 2 and the drain area 3, the value of the fixed resistors Rs shown in FIG. 3 can be heightened. For this reason, the modulation degree of the channel width can be further increased.

The fifth embodiment illustrates the example of application to the first embodiment, but, needless to say, the fifth embodiment can be applied similarly to the second to the fourth embodiments.

In the MOS transistor of the present invention, the control gate can be formed by the same gate layer as that of the main gate differently from the MOS transistor filed before by the inventors. For this reason, the MOS transistor can be manufactured without changing the prior LSI manufacturing process at all, so that an increase in the manufacturing cost can be suppressed.

Further, in the MOS transistor of the present invention, since the NMOS transistor and the PMOS transistor can be realized by the same configuration, this MOS transistor can be easily adopted into a CMOS circuit.

Figure 11:
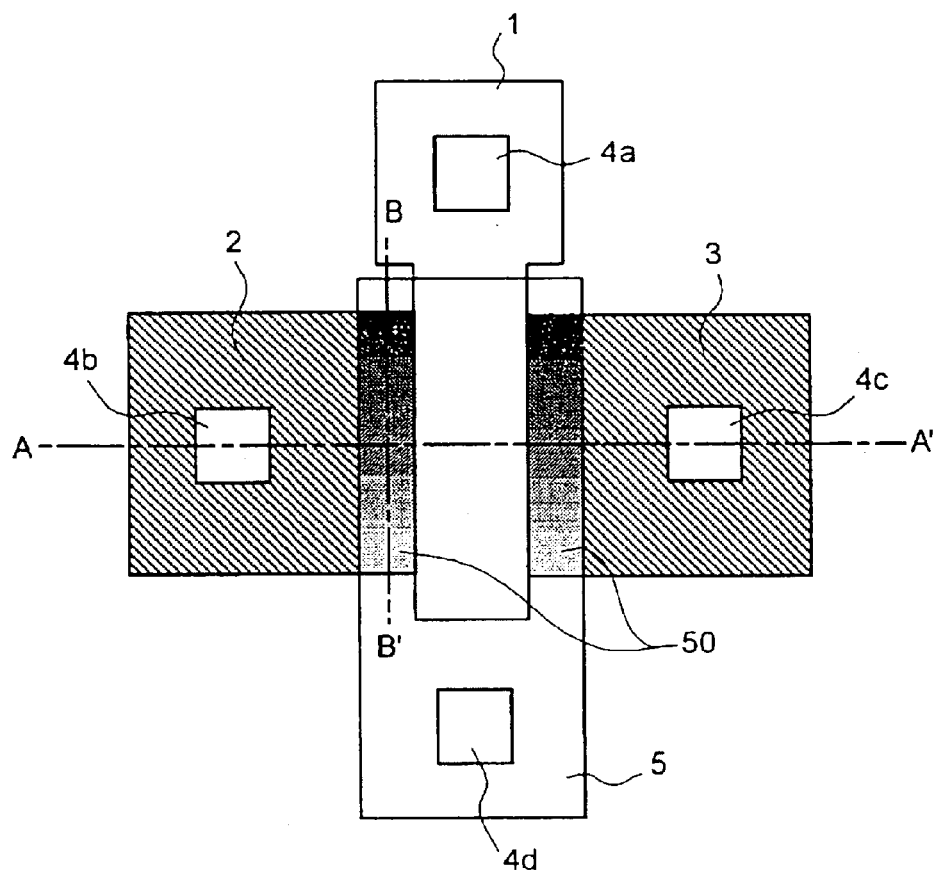
FIG. 11 is a top view illustrating a configuration of a MOS transistor according to a sixth embodiment of the present invention.
Figure 12:
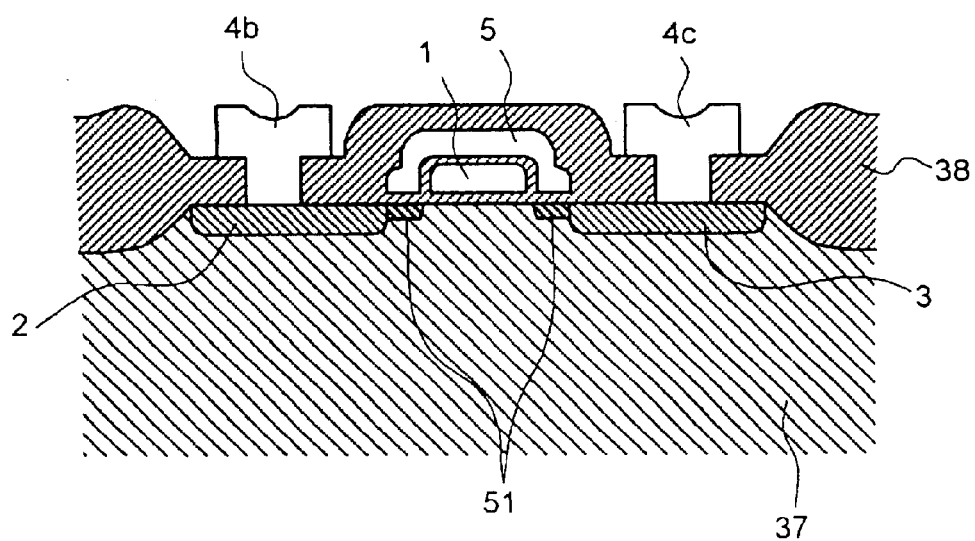
FIG. 12 is a cross-sectional view taken along line XII—XII of the MOS transistor shown in FIG. 11.
Figure 13:
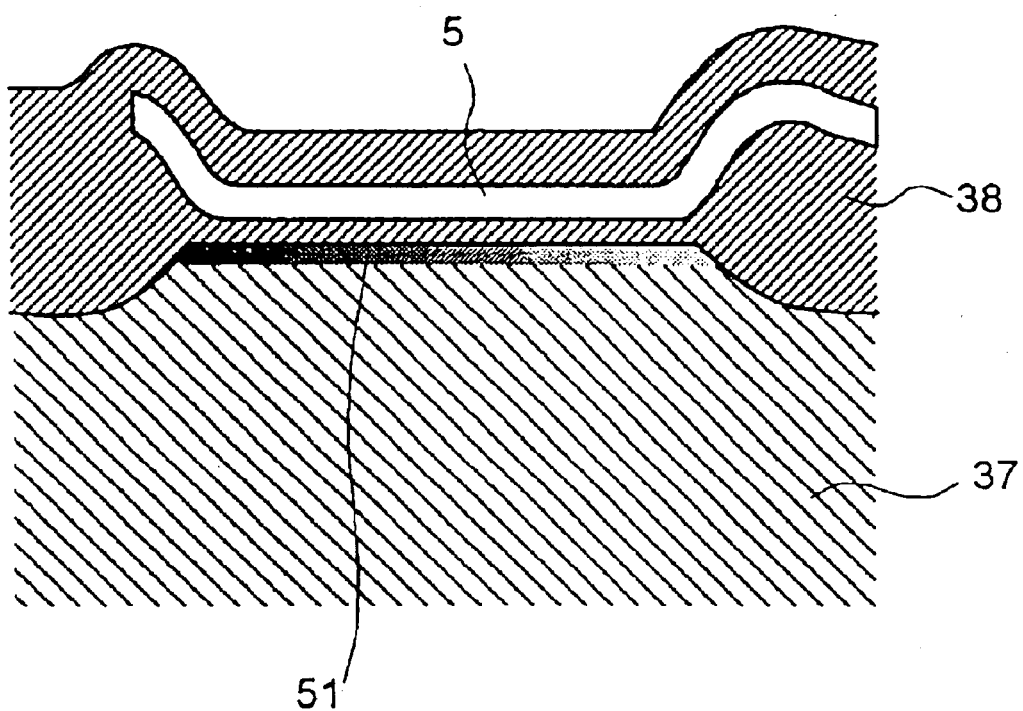
FIG. 13 is a cross-sectional view taken along line XIII—XIII of the MOS transistor shown in FIG. 11.

FIGS. 11 to 13 are pattern diagrams illustrating the configuration of a MOS transistor according to a sixth embodiment of the present invention. FIG. 11 is a top view. FIG. 12 is a cross-sectional view taken along line XII—XII of FIG. 11. FIG. 13 is a cross-sectional view taken along line XIII—XIII of FIG. 11.

In FIG. 11, as is well known, the configuration of the MOS transistor is such that the gate area 1 is provided between the source area 2 and the drain area 3 (central position) so as to cross a channel formed between the source area 2 and the drain area 3 (hereinafter, "gate channel"). The contacts 4a, 4b, and 4c composing the electrode are provided on the gate area 1, the source area 2 and the drain area 3, respectively.

In the MOS transistor according to the sixth embodiment, the gate area 1 is called as the main gate 1 in the MOS transistor, and the control gate 5 is provided so as to cover the main gate 1. As a result, the control gate channel areas 50 are formed so as to protrude on both ends of the main gate 1 in the gate lengthwise direction, namely, on the sides of the source area 2 and the drain area 3.

The control gate 5 is provided with the contact 4d composing the electrode. FIG. 11 illustrates an example in which an arrangement area of the contact 4d in the control gate 5 and an arrangement area of the contact 4a in the main gate 1are formed on opposite sides with respect to the line segment which connects the source area 2 and the drain area 3.

As shown in FIG. 12 which is a cross-sectional view parallel with the gate channel, the main gate 1 is separated from the control gate 5 by the insulating film layer 38 so as to be electrically disconnected. The channel impurity diffusion areas 51, which compose the control gate channel areas 50 formed so as to protrude on both the sides of the main gate 1 in the gate lengthwise direction, are formed on the surface of the board (well area) 37.

The impurity concentration of the channel impurity diffusion areas 51 is not uniform in the gate widthwise direction of the main gate 1. As shown in FIG. 13 which is a cross-sectional view of the control gate channel area 50 vertical to the gate channel, the impurity concentration has non-uniformity such that it changes successively from one end to the other end. FIG. 13 illustrates that as the black color is darker, the impurity concentration becomes lower.

As a result, a threshold value of the control gate channel areas 50 (hereinafter, "threshold value of the control gate 5") is not uniform in the gate widthwise direction of the main gate 1, namely, in a direction which crosses the gate channel. The threshold value has unidirectional change characteristics such that it changes successively from one end to the other end.

FIG. 11 illustrates that as the black color becomes darker, the threshold value of the control gate 5 becomes lower. That is to say, the darkest black color on the side of the contact 4a of the main gate 1 represents that the threshold value is minimum. The lightest black color on the side of the contact 4d of the control gate 5 represents that the threshold value is maximum.

The non-uniformity of the threshold value in the control gate 5 is realized by distributing the impurity concentration of the channel impurity diffusion areas 51 spatially in the gate widthwise direction of the main gate 1. The shape of the control gate 5 is, therefore, arbitrary. In general, the shape of the control gate 5 depends on the shape of the main gate 1, and thus is mostly a rectangular shape.

Figure 14:
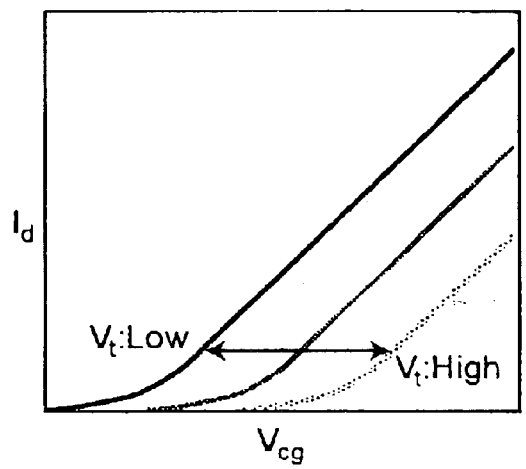
FIG. 14 is a diagram illustrating a drain current characteristic example per unit gate width controlled by the control gate of the MOS transistor shown in FIG. 1.
Figure 15:
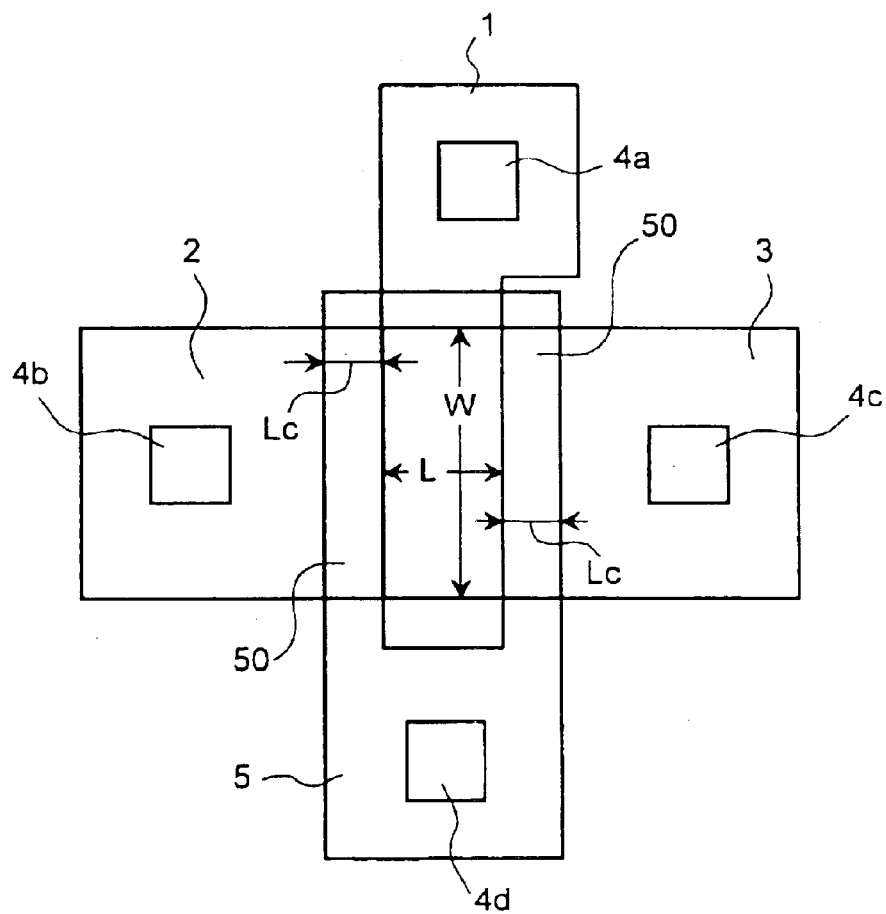
FIG. 15 is a diagram illustrating shape parameters defining the characteristics of the MOS transistor shown in FIG. 1.
Figure 16C:
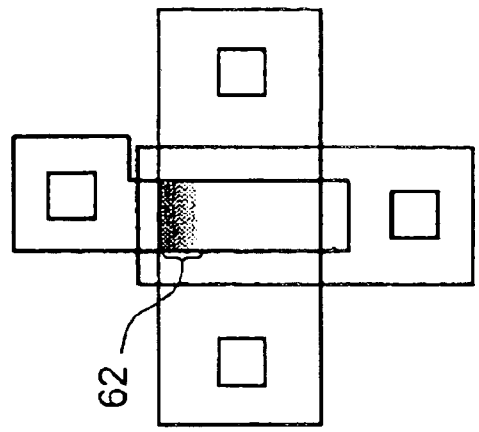
FIGS. 16A to 16C are diagrams explaining gate channel width modulation realized by the MOS transistor shown in FIG. 11.

The operating principle which modulates the gain coefficient of the MOS transistor having the above configuration is explained below with reference to FIGS. 11 to 16C. FIG. 14 is a diagram illustrating an example of drain current characteristics per unit gate width controlled by the control gate shown in FIG. 11. FIG. 15 is a diagram explaining shape parameters defining the characteristics of the MOS transistor shown in FIG. 11. FIG. 16 is a diagram explaining the gate channel width modulating operation realized by the MOS transistor shown in FIG. 11.

The threshold value of the control gate 5 has the unidirectional change characteristics such that the threshold value changes successively from one end to the other end in the gate widthwise direction of the main gate 1. For this reason, when the control voltage to be applied to the control gate 5 is changed, the width of the channels formed on the control gate channel areas 50 changes according to the distribution of the threshold value. The channels formed on the control gate channel areas 50 at this time become the effective channels in the gate area 1.

In FIG. 14, a control gate voltage Vcg of the control gate 5 is read along an axis of abscissas. A drain current Id per unit gate width for each gate threshold value Vt is read along an axis of ordinate. The left one of the three lines shown in FIG. 14 represents a characteristic curve for the lowest gate threshold value, and the right one for the highest gate threshold value. In other words, the density of each line indicates a gradation (corresponding to the gate threshold value) of the control gate channel area 50 shown in FIG. 11.

As shown in FIG. 14, as the threshold value Vt of the control gate 5 becomes lower, the drain current Id per unit gate width flows more from the low value of the control gate voltage Vcg. As the threshold value Vt becomes higher, the control gate voltage Vcg becomes higher. If not, the drain current Id on such a portion does not flow. The drain current Id flows only on a portion where the control gate voltage Vcg exceeds the threshold value Vt.

That is to say, the effective channel width of the main gate 1 can be modulated by the control voltage Vcg to be given to the control gate 5, so that the gain coefficient β of the MOS transistor can be modulated. The channel modulation characteristics to be realized can be set by the distribution of the threshold value of the control gate 5 and the shape parameters shown in FIG. 15.

In FIG. 15, as the shape parameters, the gate length L and the gate width W of the main gate 1, and the gate length Lc of the control gate are used. When they are modulated, so that the modulation characteristics of the gain coefficient β can be designed. In general, as the gate length Lc of the control gate 5 which is the control channel length is smaller, or a change amount in the distribution, of the threshold value of the control gate 5 is larger, the modulation degree of the gain coefficient β becomes larger.

Figure 16B:
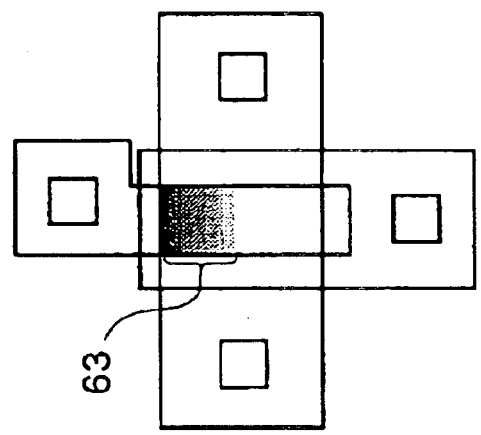
Figure 16A:
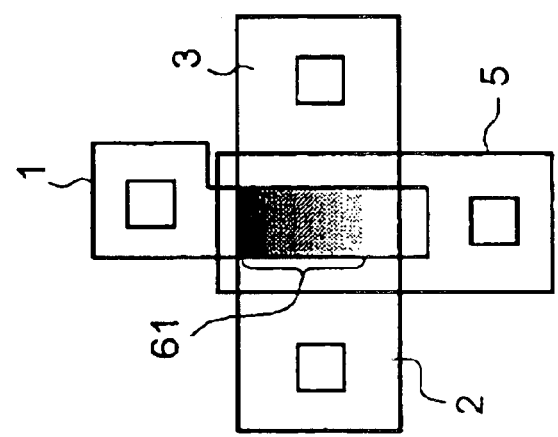

The effective channel width in the main gate 1 is, as shown in FIGS. 16A to 16C, for example, modulated by the control gate voltage Vcg. In FIG. 16, the maximum threshold value of the control gate 5 is represented by Vtmax, the minimum value is represented by Vtmin, and an intermediate value therebetween is represented by Vtmiddle.

As explained with reference to FIG. 11, the threshold value of the control gate 5 becomes gradually lower toward the contact 4a of the main gate 1. The conductance of the main gate 1 is larger in a portion where the threshold value is lower. In FIGS. 16A to 16C, therefore, the effective channel of the main gate 1 is formed on the side of the contact 4a of the main gate 1.

FIG. 16A illustrates that the control gate voltage Vcg is comparatively high (Vcg>Vtmax). In this case, the channel is formed in the most part of the control gate channel areas 50 in the control gate 5. As a result, the width of the effective channel 61 formed on the side of the contact 4a of the main gate 1 is comparatively larger towards the portion where the threshold value is higher, and the gain coefficient β becomes large. Further, the drain current in the main gate 1 flows a lot in the portion where the threshold value is low. Since the width of the effective channel 61, however, becomes comparatively larger towards the portion where the threshold value is higher, the distribution of the current is proportional to the enlargement of the width. That is to say, a change range of the drain current becomes wide.

FIG. 16C illustrates that the control gate electrode Vcg is comparatively low (Vtmiddle>Vcg>Vtmin). In this case, the channel is formed only in the portion in the control gate channel area 5 of the control gate 5 where the threshold value is lower than the intermediate value Vtmiddle. That is to say, the channel width on the control gate channel forming area 50 becomes considerably narrow. As a result, the width of the effective channel 62 formed on the side of the contact 4a of the main gate 1 falls within a range that the threshold value is low, namely, becomes comparatively small, so that the gain coefficient β becomes small. The change range of the drain current becomes considerably narrow.

FIG. 16B illustrates that the control gate voltage Vcg is middle (Vtmax>Vcg>Vtmiddle). In this case, the channel is formed up to a portion in the control gate channel forming area 50 where the threshold value is nearly the intermediate value. That is to say, the width of the channel formed on the control gate channel forming area 50 becomes large to an extent of the middle between the case of FIG. 16C and the case of FIG. 16A. As a result, the width of the effective channel 63 formed on the side of the contact 4a in the main gate 1 becomes slightly larger towards the portion where the threshold value is high than the case of FIG. 16C. For this reason, the gain coefficient β is the middle between FIGS. 16A and 16B.

In the MOS transistor of the present invention, the width of the channel formed on the control gate channel area 50 can be changed by the voltage to be applied to the control gate 5. As a result, since the effective channel width of the main gate 1 is modulated, the gain coefficient β of the MOS transistor to be a basis, namely, the drain current characteristics can be modulated successively.

The MOS transistor of the present invention adopts the configuration system which does not require the formation of a triangular area by the control gate channel required in the configuration system of the MOS transistor filed before by the inventors. For this reason, the device size can be reduced.

In the MOS transistor filed before by the inventors, the direction of the electric field to be applied to the gate channel is changed by the control gate voltage, so that the effective channel width of the main gate is modulated. In the MOS transistor of the present invention, however, the effective channel width of the main gate 1 is modulated by adjusting the width of the channel formed on the control gate channel area 50. For this reason, the modulation degree of the gain coefficient β is secured regardless of the conductance of the main gate 1, and thus the modulation characteristics of the gain coefficient β does not strongly depend on the gate voltage.

Further, since the MOS transistor of the present invention can be realized in both NMOS transistors and PMOS transistors, this can be adopted into CMOS circuits.

The electric power consumed by the modulation of the gain coefficient β is obtained only by the leak current from the control gate 5. This electric current is extremely weak, and thus this does not substantially become a problem.

Figure 17:
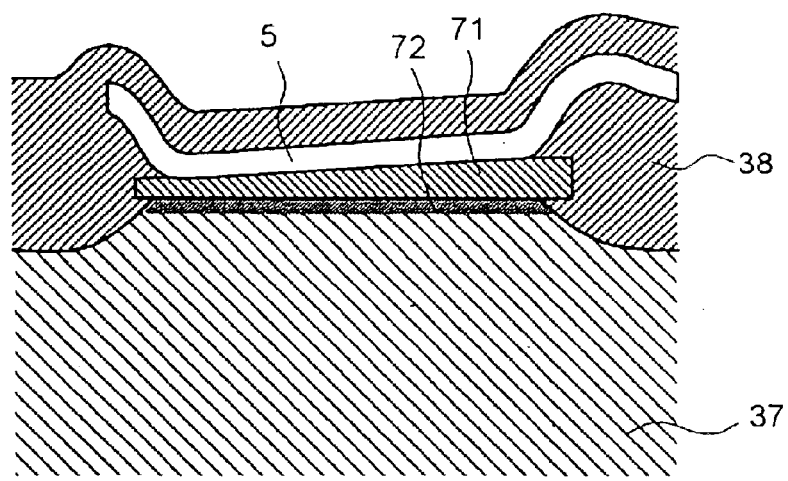
FIG. 17 is a main sectional view (cross-sectional view taken along line B–B' of FIG. 11) illustrating a configuration of a MOS transistor according to a seventh embodiment of the present invention.

FIG. 17 is a main section cross-sectional view (cross-sectional view taken along line B–B' of FIG. 11) illustrating the configuration of a MOS transistor according to a seventh embodiment of the present invention. In FIG. 17, like or equivalent components as or to those shown in FIG. 11 are designated by like reference numerals. The portions relating to the seventh embodiment are mainly explained here.

The seventh embodiment illustrates another configuration example which realizes spatial non-uniformity of the control gate threshold value. In the MOS transistor of the seventh embodiment, as shown in FIG. 17, the surface of the board 37 is covered with not the insulating film layer 38 but a gate insulating film 71 in the control gate channel areas 50 shown in FIG. 11. A thickness of the gate insulating film 71 is spatially non-uniform, namely, the gate insulating film 71 is formed so as to become gradually thicker from one end to the other end. The impurity concentration of the channel impurity diffusion area 72 formed on the surface of the board 37 is spatially uniform.

According to such a configuration, the threshold value of the control gate 5 can be spatially non-uniform, and thus the modulation effect similar to that in the sixth embodiment can be expected. In addition, in the seventh embodiment, the spatial non-uniformity of the distribution of the threshold value can be realized while the impurity concentration of the control gate channel area is uniform. For this reason, a photo mask for forming the distribution of the concentration is not required, and thus the manufacturing cost and the manufacturing steps can be reduced.

Figure 18:
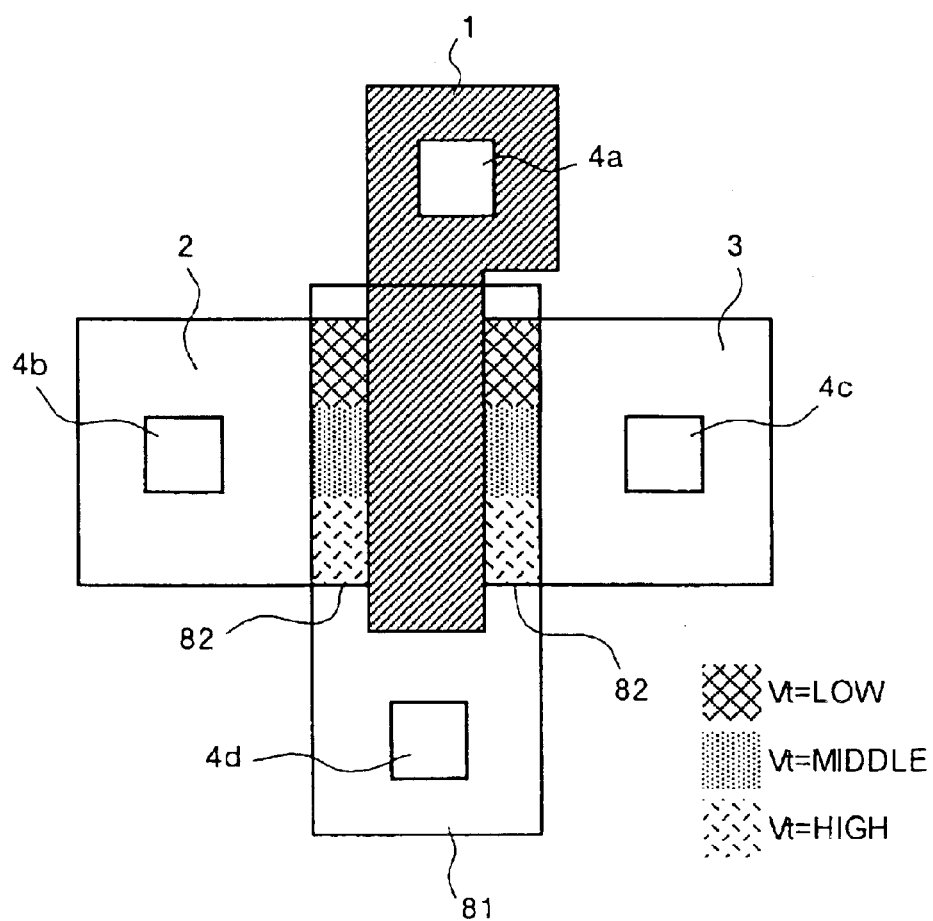
FIG. 18 is a top view illustrating a configuration of a MOS transistor according to an eighth embodiment of the present invention.

FIG. 18 is a top view illustrating the configuration of a MOS transistor according to an eighth embodiment of the present invention. In FIG. 18, like or equivalent components as or to those in the configuration of FIG. 11 are designated by like reference numerals. The portions relating to the eighth embodiment are mainly explained here.

The eighth embodiment explains still another configuration example which realizes the spatial non-uniformity of the control gate threshold value. As shown in FIG. 18, in the eight embodiment, the control gate 81 is provided instead of the control gate 5 shown in FIG. 11.

The spatial distribution of the unidirectional change characteristics of the threshold value is not successively changed in the control gate channel areas 82 of the control gate 81, but it is set so as to change stepwise. The stepwise change is equal in both sides of the main gate 1 in the gate lengthwise direction.

Specifically, as shown in FIG. 18, for example, the threshold value Vt of the control gate 81 changes in both the sides of the main gate 1 in the gate lengthwise direction as follows. The threshold value Vt is low in the gate width direction, namely, on the side of the contact 4a of the main gate 1. Vt is high on the side of the contact 4d of the control gate 81, and Vt is middle between the contacts 4a and 4d.

The control gate 81 having different threshold values can be realized by a method of changing the channel impurity concentration in each area as explained in the sixth embodiment or a method of changing the thickness of the gate insulating film as explained in the seventh embodiment.

According to the eighth embodiment, the modulation effect similar to that in the sixth embodiment can be obtained, and further it is not necessary to develop a special new means which forms the distribution of the threshold value of the control gate stepwise. As a result, a method of changing the distribution differently using a prior mask can be used.

FIG. 19 is a top view illustrating the configuration of a MOS transistor according to a ninth embodiment of the present invention. In FIG. 19, like or equivalent components as or to those in the configuration of FIG. 11 are designated by like reference numerals. The portions relating to the ninth embodiment are mainly explained here.

The ninth embodiment explains still another configuration example which realizes the spatial non-uniformity of the control gate threshold value. As shown in FIG. 19, in the ninth embodiment, the control gate 91 is provided instead of the control gate 5 shown in FIG. 11.

The spatial distribution of the unidirectional change characteristics of the threshold value is not successively changed in the control gate channel areas 92 and 93 in the control gate 91, but it is set so as to change stepwise. The stepwise change is made in the gate widthwise direction on both the sides of the main gate 1 in the gate lengthwise direction in the opposite order to that in the eighth embodiment.

Specifically, the threshold value Vt of the control gate 91 is low on the side of the contact 4a of the main gate 1, high on the side of the contact 4d of the control gate 91, and middle between the contacts 4a and 4d in the control gate channel area 93 as shown in FIG. 19, for example.

On the contrary, the threshold value Vt is high on the side of the contact 4a of the main gate 1, Vt is low on the side of the contact 4d of the control gate 41, and Vt is middle between the contacts 4a and 4d in the control gate channel area 92.

According to the ninth embodiment, the modulation effect similar to the sixth embodiment is obtained, and further not only the channel width of the main gate but also the channel length are modulated. For this reason, the gain coefficient β can be modulated more dynamically.

The ninth embodiment explained the example applied to the eighth embodiment, but this can be applied also to the sixth and the seventh embodiments. The sixth to the ninth embodiments explain that the control gate channel area is formed on both the sides of the main gate in the gate lengthwise direction. The present invention is, however, not limited to this, and the control gate channel area may be formed on one side of the main gate in the gate lengthwise direction, namely, any one of the source area side or the drain area side. This also produces the similar effect.

The MOS transistor of the present invention has such characteristics that its size is more compact and the power consumption is less than the MOS transistor filed before by the inventors. For this reason, a mechanism circuit, in which the electrical characteristics are automatically adjusted by the on-chip and the characteristics dispersion is corrected, can be packaged into every LSI device with high density.

That is to say, the characteristics dispersion due to the miniaturization of the device prohibiting future improvement in high performance of the large-scale LSI devices, deterioration in the performance due to non-uniformity of the characteristics such as a fluctuation in the device characteristics due to a fluctuation in the process, difficulty with LSI physical design, and the like can be greatly alleviated.

The device configuration technique of the present invention is, therefore, expected to contribute to realization of new type LSI devices based on completely new design concept such as a self-optimizing LSI device and a self-adapting LSI device which allow reasonably large dispersion of the device characteristics.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A metal oxide semiconductor transistor comprising:
   a semiconductor substrate having a surface with a device area, the device area having orthogonal longitudinal and transverse directions;
   a source region in the semiconductor substrate and located in the device area;
   a drain region in the semiconductor substrate and located in the device area;
   a gate layer located on and extending across the device area, along the transverse direction of the device area, and located between the source region and the drain region, wherein the source and drain regions lie along a straight line extending in the longitudinal direction of the device area; and
   a first control channel region in the semiconductor substrate and located in the device area, between the gate layer and at least one of the source region and the drain region, the first control channel region having a voltage threshold that gradually changes with position in the gate layer, along the transverse direction of the device area.

2. The metal oxide semiconductor transistor according to claim 1, further comprising a second control channel region in the semiconductor substrate and located in the device area, between the gate layer and at least one of the source region and the drain region so that the first and second control channel regions are located on opposite sides of the gate layer, wherein the first and second control channel regions have respective voltage thresholds that gradually change with position, in opposite directions, along the transverse direction of the device area.

3. The metal oxide semiconductor transistor according to claim 1, wherein the first control channel region includes a channel diffusion region that has an impurity concentration that gradually changes along the transverse direction of the device area.

4. The metal oxide semiconductor transistor according to claim 1, further comprising an insulating layer located on the first control channel region, the insulating layer having a thickness that gradually changes along the transverse direction of the device area.

5. The metal oxide semiconductor transistor according to claim 1, further comprising a second control channel region in the semiconductor substrate and located in the device area, between the gate layer and at least one of the source region and the drain region so that the first and second control channel regions are located on opposite sides of the gate layer, wherein the first and second control channel regions have respective voltage thresholds that gradually change with position, in the same direction, along the transverse direction of the device area.

6. A metal oxide semiconductor transistor comprising:
   a semiconductor substrate having a surface with a device area, the device area having orthogonal longitudinal and transverse directions;
   a source region in the semiconductor substrate and located in the device area;
   a drain region in the semiconductor substrate and located in the device area;
   a gate layer located on and extending across the device area along the transverse direction of the device area and located between the source region and the drain region, wherein the source and drain regions lie along a straight line extending in the longitudinal direction of the device area, and the gate layer covers a gate area of the device area;

a control gate layer covering a control gate area of the device area, the control gate layer having a first part extending across only part of the device area in the transverse direction of the device area and including a first end, and a second part extending across only part of the device area along the transverse direction of the device area and having a second end, the first part being located in the device area between the gate layer and at least one of the source region and the drain region with a first gap, along the transverse direction of the device area, between the first end and a boundary of the device area extending along the longitudinal direction of the device area; and a diffusion region in the semiconductor substrate and located in the device area, between the gate area and the control gate area.

7. The metal oxide semiconductor transistor according to claim 6, wherein the gate layer and the control gate layer are located in a common plane.

8. The metal oxide semiconductor transistor according to claim 6, wherein a portion of the second part of the control gate layer is disposed outside the device area.

9. The metal oxide semiconductor transistor according to claim 6, wherein the second part of the control gate layer is located on the device area, between the gate layer and one of the drain region and the source region so that the first and second parts of the control gate layer are located on opposite sides of the gate layer, and including a second gap along the transverse direction of the device area between the second end of the second part of the control gate layer and the boundary of the device area.

10. The metal oxide semiconductor transistor according to claim 6, wherein
the gate layer has, outside the device area, a first contact area connected to a first electrode,
the gate control layer has, outside the device area, a second contact area connected to a second electrode, and
the first contact area and the second contact area are disposed on the same side of the device area.

11. The metal oxide semiconductor transistor according to claim 6, wherein
the gate layer has, outside the device area, a first contact area connected to a first electrode,
the gate control layer has, outside the device area, a second contact area connected to a second electrode, and
the first contact area is on an opposite side of the device area from the second contact area.

12. The metal oxide semiconductor transistor according to claim 6, wherein
the first and second parts of the control gate layer are located on the device area between the source region and the gate layer,
the second end and the first end are located opposite each other and separated by a second gap, and
the control gate layer has a third part connecting the first part to the second part, at least part of the third part being located outside the device area.

13. The metal oxide semiconductor transistor according to claim 6, wherein the diffusion region has the same conductivity type as the source region and the drain region, and an impurity concentration lower than impurity concentrations in the source region and the drain region.

* * * * *